(12) United States Patent
Prosser

(10) Patent No.: US 9,912,184 B2
(45) Date of Patent: *Mar. 6, 2018

(54) DELAYED REACTIVE ELECTRICAL CONSUMPTION MITIGATION

(71) Applicant: Green Charge Networks LLC, Santa Clara, CA (US)

(72) Inventor: Ronald D. Prosser, Huntington Beach, CA (US)

(73) Assignee: Green Charge Networks LLC, Santa Clara, CA (US)

( * ) Notice: Subject to any disclaimer, the term of this patent is extended or adjusted under 35 U.S.C. 154(b) by 112 days.

This patent is subject to a terminal disclaimer.

(21) Appl. No.: 14/724,678

(22) Filed: May 28, 2015

(65) Prior Publication Data

US 2015/0295449 A1    Oct. 15, 2015

Related U.S. Application Data

(63) Continuation of application No. 13/405,187, filed on Feb. 24, 2012, now Pat. No. 9,048,671.

(51) Int. Cl.
*H02J 7/00* (2006.01)
*G01R 21/00* (2006.01)

(52) U.S. Cl.
CPC .......... *H02J 7/0063* (2013.01); *G01R 21/00* (2013.01); *H02J 7/0026* (2013.01); *H02J 2007/004* (2013.01); *H02J 2007/0067* (2013.01)

(58) Field of Classification Search
CPC ................................. H02J 7/0031

USPC .......................................... 320/135
See application file for complete search history.

(56) References Cited

U.S. PATENT DOCUMENTS

2012/0065792 A1* 3/2012 Yonezawa ............ H02J 3/14
                                                700/291
2014/0122906 A1* 5/2014 Whitted ............... H02J 9/061
                                                713/300

* cited by examiner

*Primary Examiner* — Edward Tso
*Assistant Examiner* — Ahmed Omar
(74) *Attorney, Agent, or Firm* — Richard C. Galati; Holland & Hart LLP

(57) ABSTRACT

The electrical consumption mitigation provided by energy storage systems can be unreliable when a consumption peak lasts long enough to deplete the energy stored and the remainder of the peak is unmitigated. By implementing a waiting period between detecting the peak and discharging the energy storage in which characteristics of the peak are observed, a peak mitigation system can lengthen the effective discharge duration of the energy storage system and prevent unmitigated plateaus from appearing. For example, when a consumption plateau is detected, the system may discharge at a slower rate than when a spike is detected in order to prolong mitigation activities before the conclusion of the plateau. Thus otherwise-incurred demand-related utility charges can be reduced without having to increase the capacity of the mitigation system. In some cases, these processes are performed with respect to the bounds of demand-averaged time periods used to calculate demand charges.

20 Claims, 11 Drawing Sheets

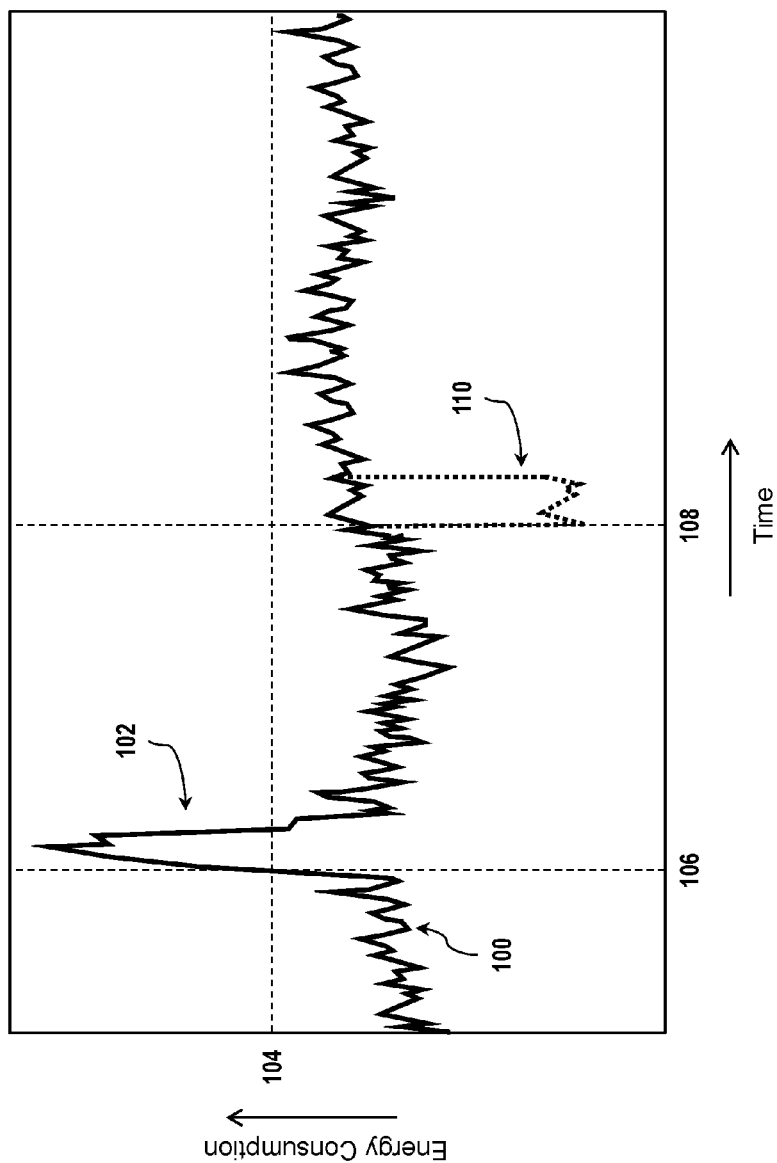

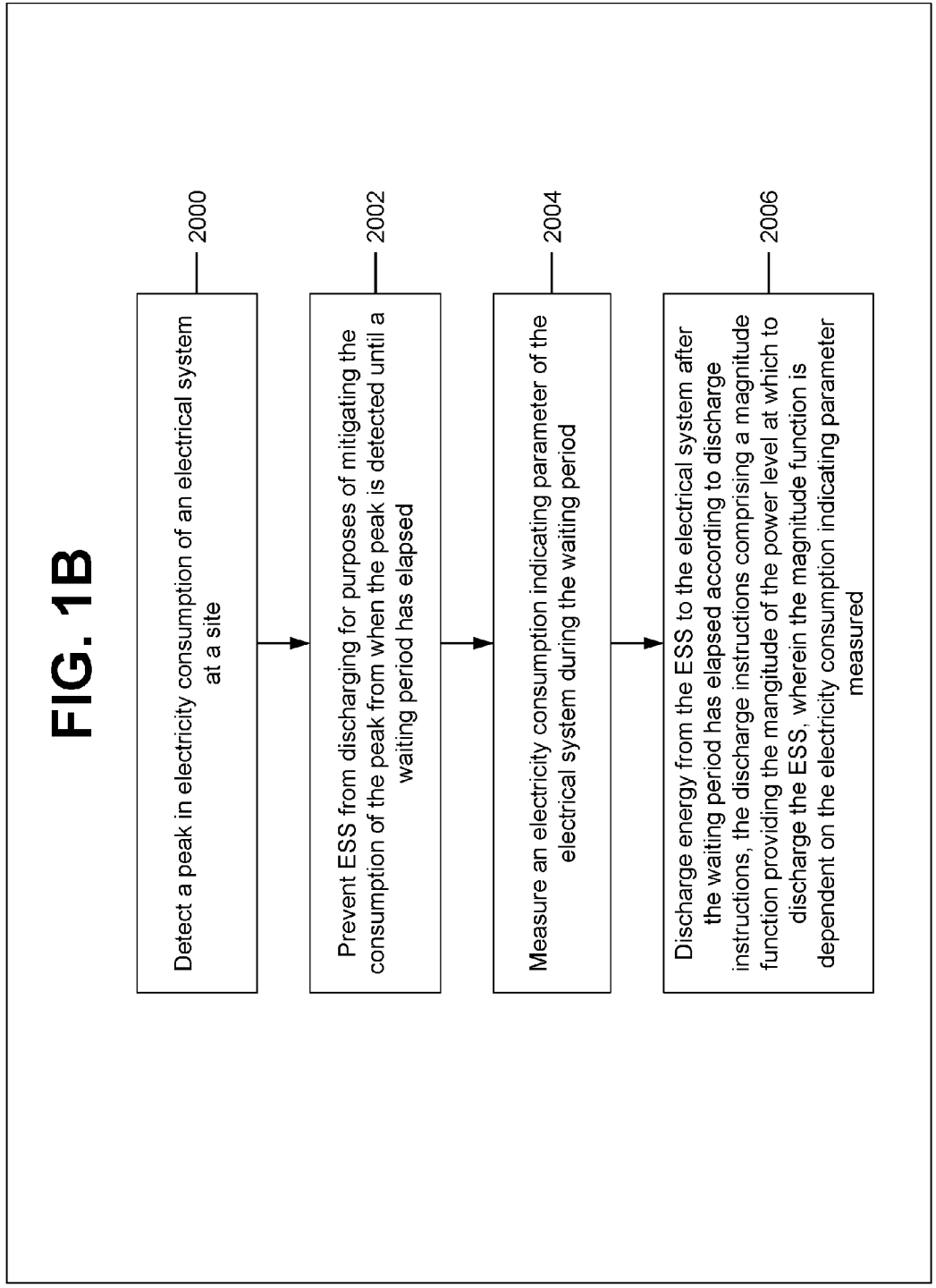

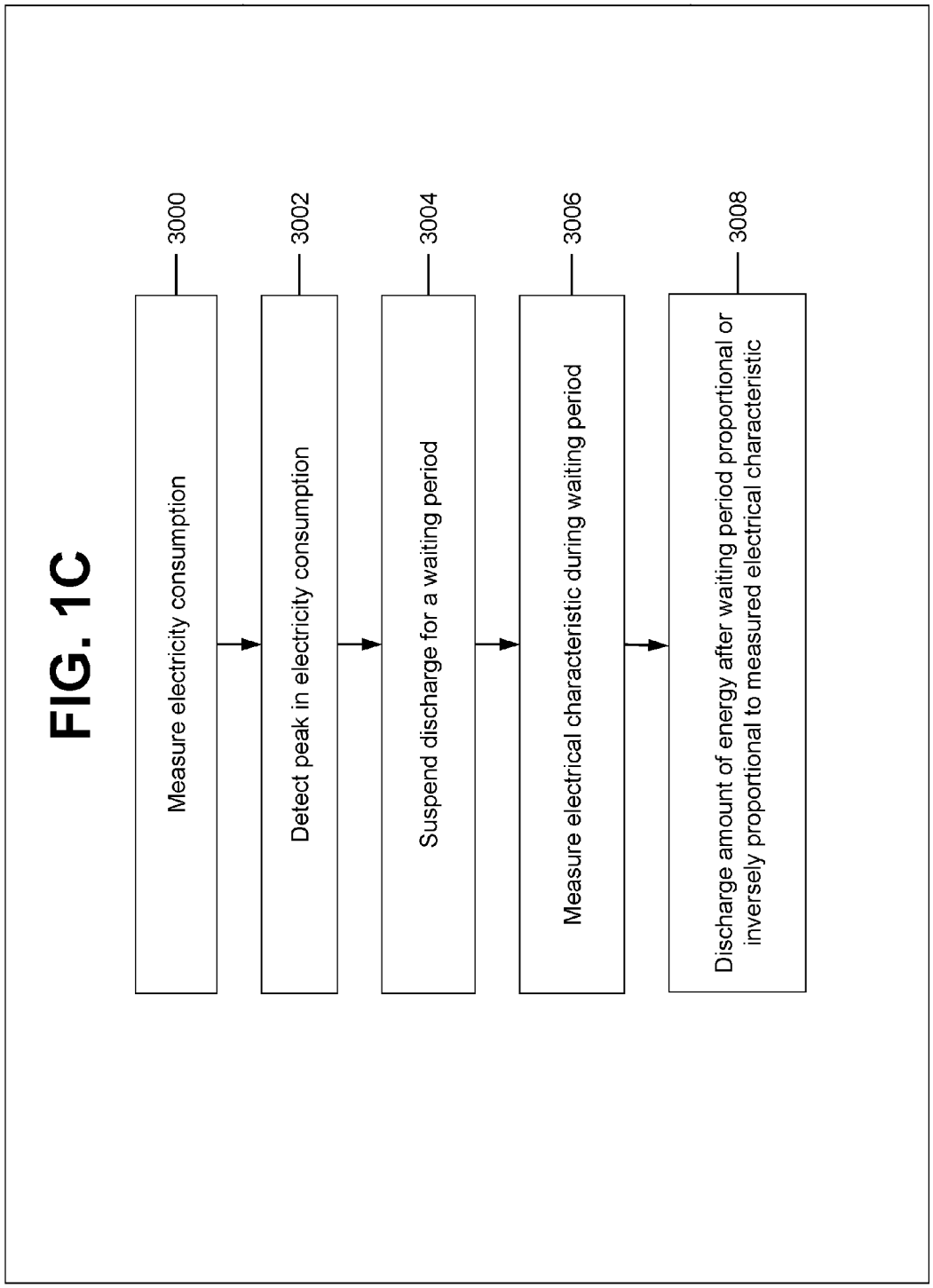

DELAYED REACTIVE ELECTRICAL CONSUMPTION MITIGATION

CROSS REFERENCE TO RELATED APPLICATIONS

This application is a continuation application of U.S. patent application Ser. No. 13/405,187, filed 24 Feb. 2012 and entitled DELAYED REACTIVE ELECTRICAL CONSUMPTION MITIGATION, the disclosure of which is incorporated, in its entirety, by this reference.

BACKGROUND

The present invention is directed to the fields of energy storage system (ESS) management systems, electrical demand charge management, and related fields.

With the electrical demand of a customer in today's electrical distribution grid rising at a restless pace, electricity providers have had to find ways to prevent or discourage overloading of the transformers, feeders, and mains across their distribution networks. In some areas, utilities have adopted the practice of billing demand charges, which are electricity bills assessed in proportion to the highest consumption drawn by a customer during a billing cycle (e.g., over one month). When calculating demand charges, utility providers typically measure facility energy usage over short predetermined time periods (e.g., every ten or fifteen minutes), calculate and store the average level of demand for each of these periods, and then generate the demand charge billed to the customer based on the highest level of averaged consumption experienced by the end of the billing cycle. Thus, even brief spikes in demand can have a dramatic effect on demand charges.

Demand charge management is the practice of reducing demand charges. It usually involves reducing the peak electrical load drawn at a site at times when utility costs are high or when consumption at the site is high, thereby reducing the averaged demand across sections of a billing cycle. Consumers have adopted peak mitigation and peak shaving techniques to manage demand charges wherein an ESS is discharged to the grid at the moment when an excessive increase in the electrical demand is encountered in order to offset or nullify the contribution of the increased demand at that time to the final demand averages calculated by the utility provider when determining a demand charge.

Elevated demand periods may be classified as spikes and plateaus. A spike in demand is an increase in demand that is short, perhaps a few seconds or minutes long, that is in excess of the highest demand value (or highest average demand value) previously experienced during that billing cycle. A plateau in demand is an extended period of increased consumption exceeding that highest demand value (or averaged demand value), such as a peak in consumption that can last for many minutes or hours.

Existing peak mitigation systems are inefficient when they need to address both spikes and plateaus of consumption. If a peak in consumption is experienced, present systems immediately discharge the ESS to diminish the peak to avoid causing new demand charges. Depending on the ESS capacity of the system, this technique is most effective when brief demand spikes are encountered. If an extended plateau is encountered and the ESS capacity (or state of charge) is insufficient to mitigate the entire plateau, the system will run out of energy while mitigating and at least part of the plateau will go unmitigated. Alternatively, a low-capacity system may be discharged at a lower rate when a peak is experienced in order to allow the system to discharge for longer before depleting, but if the magnitude of the peak is much higher than the average consumption at the site, the low-rate discharge may not produce enough mitigation to keep the peak from producing an increased demand charge.

Because of the nature of demand charge calculation, even brief unmitigated peak periods can result in extreme demand charges. Increasing the available ESS capacity is a logical way to avoid this kind of unmitigated plateau scenario, but ESS capacity can be very expensive per kilowatt, especially when the ESS is a battery system. Furthermore, although large ESS capacity systems can service plateaus in consumption without allowing peaks to go unmitigated, they are oversized and not cost-effective for mitigating consumption spikes.

SUMMARY

The present invention may help mitigate spikes and plateaus of electricity consumption in demand management systems such as those having insufficient ESS capacity to completely mitigate extended plateaus. Embodiments of the invention provide a means for maximizing the cost-effectiveness of discharging energy stored in the ESS and optimizing the length of time that the ESS is able to discharge when a peak occurs in light of non-instantaneous calculation of demand charges by the utility provider.

Embodiments of the invention delay electrical consumption mitigation when a peak in consumption appears, detect information about the nature of the peak, such as its length and magnitude, and determine the optimal method of discharging the ESS to mitigate the peak based on these factors. For example, in some embodiments demand spikes may be addressed with short, powerful discharges designed to drive down the average consumption logged during the demand-averaged period in which the spike appears in order to completely compensate for the occurrence of the spike or they may address demand plateaus using longer, less powerful discharges to minimize the effect of the plateau on the average demand, even if the effect of the occurrence of the consumption plateau on the demand average is not completely nullified. In some embodiments this is preferable to discharging the ESS at full power during the start of the plateau, then letting it deplete completely and having the remainder of the plateau register unmitigated by the power meter at the site.

In some embodiments these activities are performed with respect to the limits of the demand-averaged period in which the peak appears, but in some embodiments the limits of the demand-averaged period do not directly affect the discharging of the ESS. In some embodiments the system has a rechargeable ESS, and the need for the ESS to recharge is balanced against the need for the system to mitigate peaks.

In some embodiments, the system does not discharge the ESS or curtail a peak if it is lower than a prior peak level from the same billing cycle. In other embodiments the ESS only curtails a peak enough to prevent the demand average for that demand-averaged period from exceeding the prior peak level. This may prolong the lifespan of the ESS and reduce the cost of repetitively recharging it.

Additional and alternative features, advantages, and embodiments of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In addition to the novel features and advantages mentioned above, other objects and advantages of the present invention will be readily apparent from the following descriptions of the drawings and exemplary embodiments.

FIG. 1 is a graph showing energy consumption over time that is monitored by an energy consumption mitigation controller and illustrates the effect of a delayed spike mitigation process of an embodiment of the invention, FIGS. 1B and 1C are flowcharts showing processes according to the present disclosure.

DETAILED DESCRIPTION

General Information

Embodiments of the invention are directed to methods and systems of controlling energy consumption through use of energy storage systems (ESSs) by monitoring the characteristics of the energy consumption over time before determining the ESS discharging or charging methods that will be implemented to mitigate spikes and plateaus in the consumption observed. Some preferred embodiments of these methods and systems reduce the effect of spikes and plateaus on demand charges by maximizing the length of time that the ESS can mitigate a spike or plateau by delaying the depletion of an ESS until after a plateau in consumption subsides. These and other features and advantages of embodiments of the invention will now be described in detail.

Some embodiments mitigate energy consumption of an electrical system at a site, such as, for example, a building, office, installation, store, or other location that has an internal electrical network that is subject to billing based on electricity consumption from an electrical utility distribution grid. In some embodiments this electrical system or site is not stationary, such as a mobile workstation that can be connected to the grid. In some embodiments the methods and systems of embodiments of the invention are implemented in connection with certain devices or electrical systems at a site and not necessarily with respect to all sources of consumption at the site, but in other embodiments all sources of consumption at the site may be measured, monitored, and/or mitigated. In this document, embodiments will be described as taking place at a site, thereby including all electrical systems at the site, but it is to be understood that where possible, these embodiments are intended to also encompass embodiments where subdivisions or portions of a site or certain electrical systems at the site have their consumption managed.

Figure 1A:
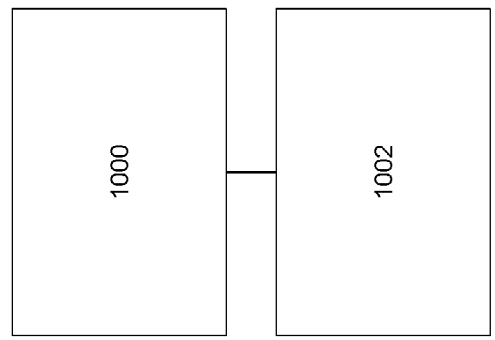
FIG. 1A is a block diagram of an apparatus according to the present disclosure.

Some embodiments mitigate consumption by discharging energy from the ESS through a connection to the local electrical utility distribution grid, and the ESS is recharged using the same connection to the distribution grid or some other source of electrical energy. In other embodiments, the ESS is not rechargeable or does not regain charge using energy from an electrical distribution grid or other electricity source, such as when the ESS is a generator or other fuel-based or otherwise non-rechargeable asset. In embodiments where only certain electrical systems are mitigated, the ESS may discharge to provide energy to those systems alone and recharge from a connection to the distribution grid or some other source of electrical energy. The charging and discharging of the ESS is maintained by a controller 1000 (see FIG. 1A) capable of changing the status of the ESS between charging and discharging. In some exemplary cases the controller 1000 is a computer, analog or digital control circuit, embedded logic circuit, or other similar device capable of monitoring the consumption of the site and controlling a charge or discharge event using the ESS. In the event that the controller 1000 is a computer or other electronic device or circuit, the processes and patterns that are part of the embodiments disclosed herein may be stored or embodied as executable code in a computer readable medium 1002 (see FIG. 1A) such as a tangible computer-readable medium and configured to cause the controller 1000 to configure operational parameters of these methods.

The ESS may be comprised of batteries, capacitors, flywheels, a distributed generation asset such as a natural gas, gasoline, diesel, ethanol, or biodiesel generator, another energy storage means used in demand charge management, or combinations or multiples thereof.

A peak in consumption, whether it is a spike or a plateau, is detected when the consumption at the site reaches or exceeds a peak triggering threshold, when the rate of consumption reaches a peak triggering threshold, the consumption has exceeded a peak triggering threshold for a certain length of time, or a combination of these or similar metrics is detected. For the purposes of explaining the embodiments shown in the accompanying figures, a peak is detected when the consumption of the site reaches a peak triggering threshold, but the other methods of peak detection may be substituted therefor unless otherwise stated.

A peak in consumption ends when the consumption of the site falls below the peak triggering threshold, when the average consumption for a preset length of time falls below the peak triggering threshold, when the peak triggering threshold changes to a value above the consumption of the site, combinations of these factors are detected, or other similar requirements are satisfied.

Spike Mitigation An exemplary embodiment is illustrated in FIG. 1, which is a graph of energy consumption over time as it is monitored by an energy consumption mitigation controller. See block 3000 in FIG. 1C. FIG. 1 illustrates the effect of a delayed spike mitigation process of an embodiment of the invention. The graph shows the unmitigated energy consumption of the site 100 over time wherein a peak in consumption 102 is detected (see block 2000 in FIG. 1B and block 3002 in FIG. 1C) when the consumption 100 exceeds the peak triggering threshold 104 at time 106. After detecting 2000 the peak 102, a delay or waiting period begins that until the end of the waiting period, time 108. During the waiting period, the controller suspends (see block 2002 in FIG. 1B and block 3004 in FIG. 1C) ESS discharging activities that would mitigate the peak 102 (see block 2002 in FIG. 1B and block 3004 in FIG. 1C), but it continues to monitor the consumption of the site 100 to determine whether the peak 102 detected is a spike or a plateau in consumption. See block 2004 in FIG. 1B and block 3006 in FIG. 1C. At time 108, if the controller has determined that the peak 102 was a spike, the ESS is discharged in a manner that will mitigate the effect of the peak on the average demand within the present demand-averaged period as completely and efficiently as possible. See block 2006 in FIG. 1B and block 3008 in FIG. 1C. For example, it may be discharged at the maximum power level for the length of time needed to bring the average demand over that period to a level it would have been if no peak had appeared. Dashed line 110 illustrates the consumption of the site that would register on a utility electrical consumption tracking meter if the peak 102 is fully mitigated in this manner, i.e., if the discharge of the ESS were to completely eliminate the effect of the peak 102 on the demand average for the demand-averaged period in which the peak 102 appeared.

The vertical distance between the unmodified consumption line 100 and the mitigated consumption line 110 illustrates the magnitude or rate of discharge of the ESS during the mitigation period. A larger distance indicates higher power discharge, and a smaller distance indicates lower power discharge, since the magnitude of the distance is directly related to the drop in energy consumption that appears when the ESS is discharged into the site.

After the conclusion of the discharge period 110, the controller continues to monitor the consumption of the site, but it does not exceed the peak triggering threshold again, so there are no other waiting or discharging periods shown.

Plateau Mitigation

Figure 2:
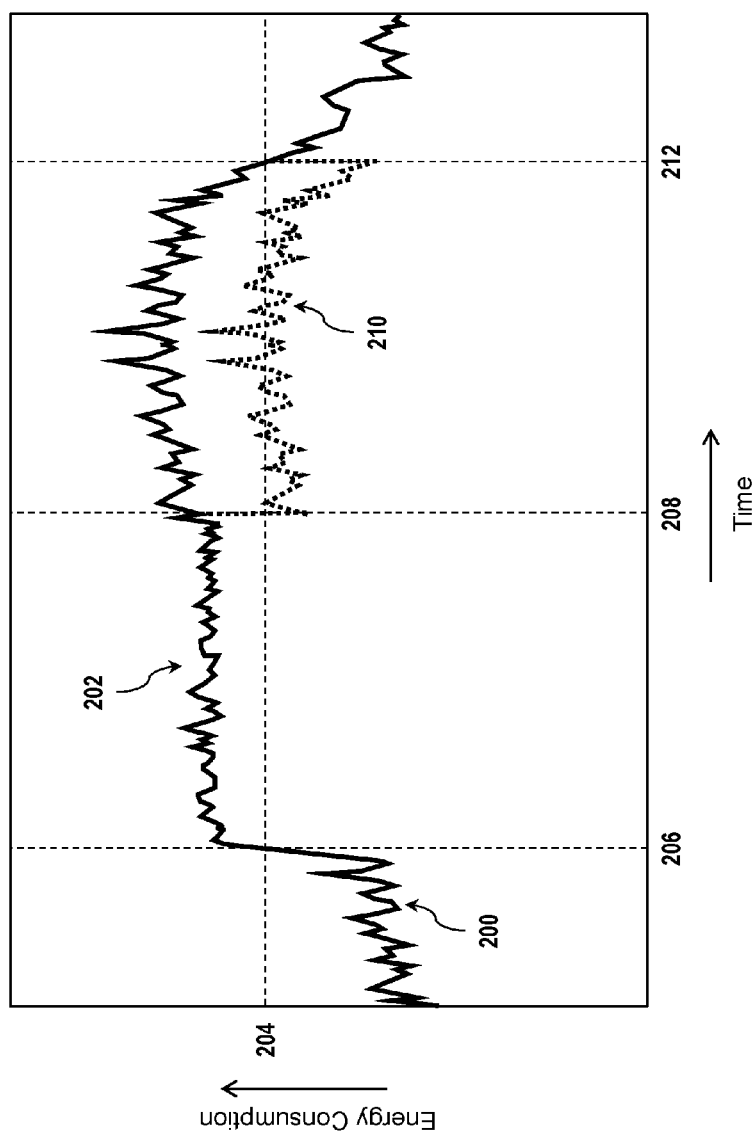
FIG. 2 is a graph showing energy consumption over time that is monitored by an energy consumption mitigation controller and illustrates the effect of a delayed plateau mitigation process of an embodiment of the invention.

In FIG. 2, a different energy consumption record is graphed over time. The controller in this instance detects the consumption of the site 200 forming a plateau 202 after exceeding the peak triggering threshold 204 at time 206, and remaining above the threshold until time 208, the conclusion of the waiting period.

A spike and a plateau of consumption appear the same to the monitoring controller when first detected (e.g., at time 206), but by the end of the waiting period (e.g., time 208) the controller determines whether the peak experienced will be treated as a spike or a plateau for purposes of determining the nature of the discharge of the ESS.

There are ways that a plateau may be detected that may vary in each embodiment of the invention. First, the controller may determine that a peak is a plateau if the consumption level measured at the conclusion of the waiting period exceeds the peak triggering threshold (e.g., line 204). Second, a peak may be a plateau if the average consumption rate over the duration of the waiting period exceeds the peak triggering threshold or if the average consumption rate over portions of the waiting period (e.g., the final half of the period) exceeds the peak triggering threshold level. Third, a plateau may be registered if the average consumption rate over the duration of the waiting period is not substantially far below to the peak triggering threshold and the final consumption rate exceeds the peak triggering threshold. Finally, additional embodiments may combine these methods of plateau detection such as using different detection methods at different times of the day or month or year, using different methods based on a historical analysis of the consumption of the site, using different methods depending on the level of a peak triggering threshold that is adjustable, or other like variations.

By comparison, the controller may determine that a peak is a spike in consumption instead of a plateau if, for example, the final consumption level during the waiting period is below the peak triggering threshold or the average consumption level over the waiting period is below the peak triggering threshold (even though the spike exceeded the peak triggering threshold at least at the time the waiting period began). Combinations and variations of these spike detection methods may also arise based on time of day, month, or year, level of peak triggering threshold, etc., similar to the plateau detection methods. If the consumption never exceeds the peak triggering threshold, no peak is registered, regardless whether it could be considered a spike or plateau. (See also FIG. 8 and its accompanying description below.) For this reason, the peak triggering threshold must be carefully selected to prevent missing opportunities to mitigate peaks while also minimizing detection of too many peaks for the ESS to effectively manage.

In the embodiment shown in FIG. 2, the peak 202 is detected as a plateau because the consumption level at time 208 exceeds the peak triggering threshold 204. The peak 202 could alternatively be determined to be a plateau since the average consumption during the peak 202 (i.e., from time 206 to time 208) also exceeds the threshold 204. The controller initiates discharging after time 208 until the peak ends at time 212, and the mitigated or metered consumption level is shown as dotted line 210. The plateau ends when the consumption level 200 falls below the peak triggering threshold 204.

The magnitude of the rate of ESS mitigation discharging in FIG. 2 is less than the magnitude of the rate of ESS mitigation discharging in FIG. 1. This illustrates that the detection of a plateau in consumption may affect the way the controller discharges the ESS. In response to peak 202, the controller sets the rate of ESS discharge at a lower level than the rate of ESS discharge in response to peak 102 so that the ESS will be able to mitigate for a longer period of time without depleting completely. In the embodiment of FIG. 1, however, a high ESS discharge rate may be used to produce curve 110 because the spike has subsided and there is no risk of depleting the ESS while mitigating the effect of the spike on the demand average for the demand averaged period in which the spike appeared. If the high discharge rate of FIG. 1 was used over the length of the entire remainder of plateau 202, the ESS would be depleted before the plateau subsided at time 212, leading to a portion of an unmitigated plateau that would drive up the averaged demand for the demand averaged period and resulting demand charges. The magnitude of the rate of ESS mitigation discharging for a plateau may be decreased if the state of charge of the ESS is below a threshold value (e.g., 50%) or the magnitude of the plateau is especially great when the discharging must begin, thereby delaying a scenario where the plateau would go unmitigated. See also block 3008 in FIG. 1C.

Ideally, an ESS would be able to completely mitigate a peak such as plateau 202. The mitigation would ensure that in the period shown from time 206 to time 212, the average consumption would be at least reduced to the "noise" level of a non-peak consumption period, or at least to a level that is low enough to prevent a new maximum averaged demand level for the demand averaged period in which the mitigation took place. However, since the ESS has limited capacity, one of the best alternative outcomes would be limiting the magnitude of a new maximum averaged demand level for the demand period. The mitigated consumption level 210 shown in FIG. 2 is not low enough to completely counteract the effect that peak 202 would have on the averaged demand for the period shown from time 206 to time 212. Instead, it would provide a final average demand for this period that is somewhat higher than the peak triggering threshold 204, but this average would still be considerably lower than the final average would be if there had been no mitigation and lower than the final average would be if the plateau had been allowed to go unmitigated due to the ESS being depleted during the mitigation process.

In the embodiment illustrated in FIG. 2, there are points at which the mitigated consumption 210 exceeds the peak triggering threshold 204. The controller does not use these values to trigger a new waiting period in this case because the ESS is currently discharging to mitigate a plateau. In other embodiments, the controller may use these "while-mitigating" peaks as the basis for a new waiting period.

The exemplary mitigation period 210 shown ends at time 212, when the unmitigated consumption 200 falls below the peak triggering threshold 204, but in other embodiments the controller continues to mitigate until (1) the ESS reaches a specified state of charge (e.g., 0%), (2) the unmitigated consumption falls below a second threshold that may be higher or lower than the peak triggering threshold 204 (e.g., the previous maximum demand average value for that billing cycle or the average demand level during non-peak conditions), or (3) a calculated or predetermined time period has elapsed.

Adjustment of Mitigation Factors

It may be advantageous to carefully select the peak triggering threshold so that it is great enough to not detect consumption level noise as "false positive" peaks (leading to excessive discharging of the ESS for little benefit in demand charge reduction) but low enough that the ESS is discharged frequently enough to have a positive impact on the average demand. For example, in one embodiment the peak triggering threshold may be variable, where it is set to match the highest average demand value that the site has recorded during the current billing cycle. In this manner, the ESS will in most cases not be discharged unless it will have some impact on minimizing the impact of a peak on the demand average, since if the consumption at the site is not exceeding prior demand averages, the discharge of the ESS will not have an impact on the demand charge and may instead lead to wear on the ESS and the accompanying equipment at the site.

Because demand-averaged periods have a fixed time length, it is possible that a fixed-length waiting period following the detection of a peak will overlap the point in time between two demand-averaged periods or would leave little or no time after the waiting period ends to discharge the ESS or otherwise react to the peak. In these cases, the waiting period could be detrimental to the demand average for the demand-averaged period that is ending soon after the waiting period starts by letting the peak consumption go on unmitigated for too long. Thus, in some embodiments the length of the waiting period may be flexible, such as, for example, being shortened based on the time remaining in the demand-averaged period in which it begins, being shortened if the peak is detected to be a spike early on in the waiting period and any additional waiting is unlikely to detect other peak activity, or being lengthened or shortened based on detection of other similar conditions. If the waiting period is too short, however, it may not be possible to reliably determine whether a peak detected is a spike or a plateau, so this must also be taken into consideration.

In some embodiments it may be preferable to simply disable the waiting period after a certain length of time has passed in the demand-averaged period so that the ESS mitigates a peak at a predetermined power level immediately when the peak is detected. Ideally, in these embodiments the length of time that the ESS is permitted to revert to immediate mitigation and the power level at which the ESS is allowed to immediately mitigate are minimized so that the ESS is less likely to deplete completely during these exceptional circumstances. If the peak is a plateau that is detected near the end of a demand-averaged period and continues into the next period, in these embodiments it may be advantageous to allow immediate mitigation during the time remaining in the first period, then to start a waiting period at the start of the next period to allow the controller to calibrate the ESS discharge rate for the remainder of the plateau.

Peak Detection and Discharge Strategy

Additional peak detection and discharge strategies according to embodiments of the invention will now be described in connection with FIGS. 3 through 8, which depict various peaks that may be detected by a mitigation system controller.

Figure 3:
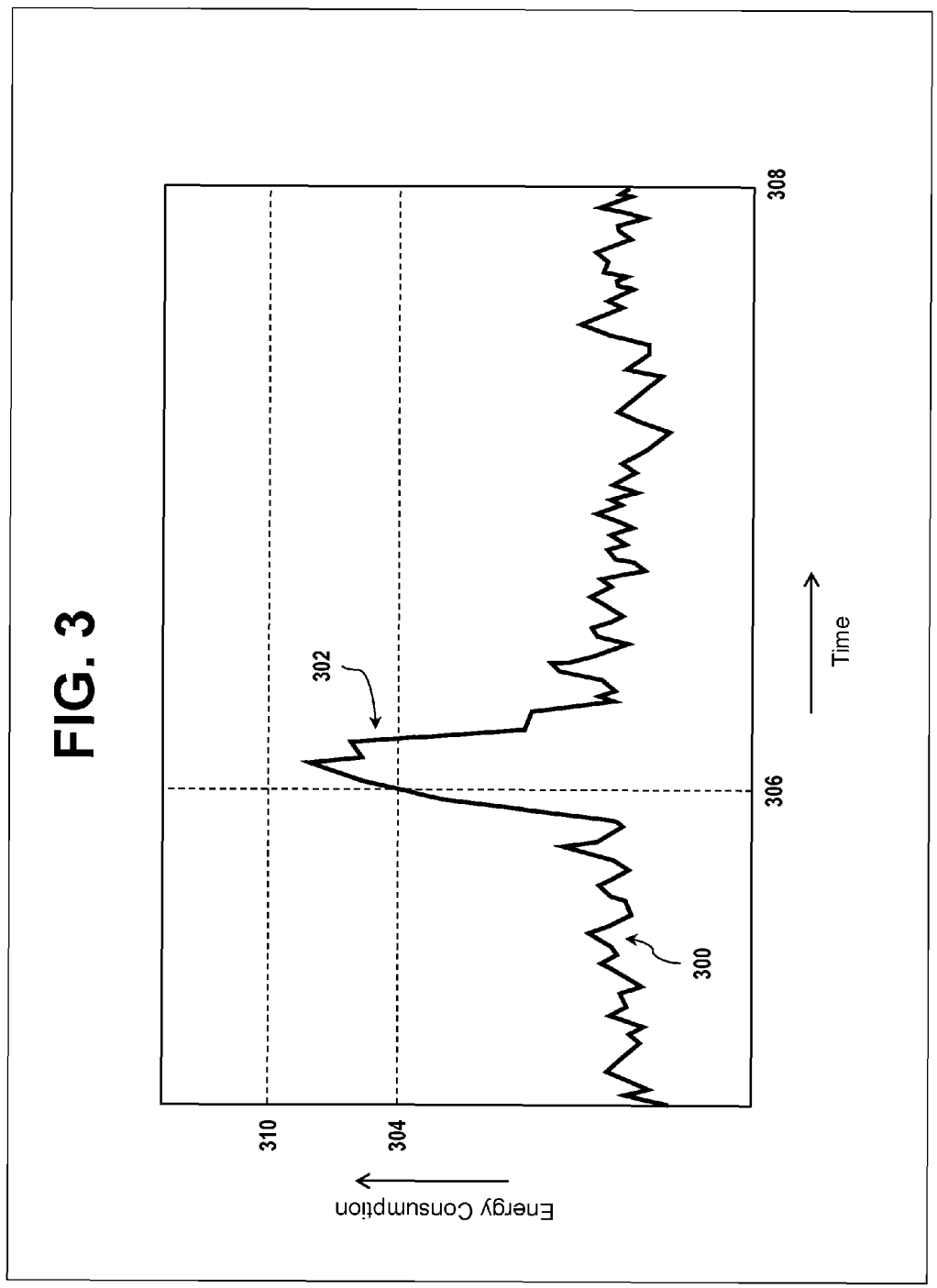
FIG. 3 is a graph showing energy consumption over time that is monitored by an energy consumption mitigation controller illustrating the conditions in which the controller will react to a spike in consumption.

FIG. 3 is a graph of energy consumption of a site over time. Here, the site's measured consumption 300 has a peak 302 that is detected when consumption surpasses the peak triggering threshold 304 at time 306. After a short time, the consumption returns to a normal, nominal level until the end of the waiting period 308. The peak 302 does not exceed an upper consumption threshold 310. In response, the controller of this embodiment discharges the ESS at maximum power for a time long enough to counteract the effect the peak 302 would have on driving up the average demand of the current demand-averaged period beyond the previous maximum average demand in this billing cycle.

Figure 4:
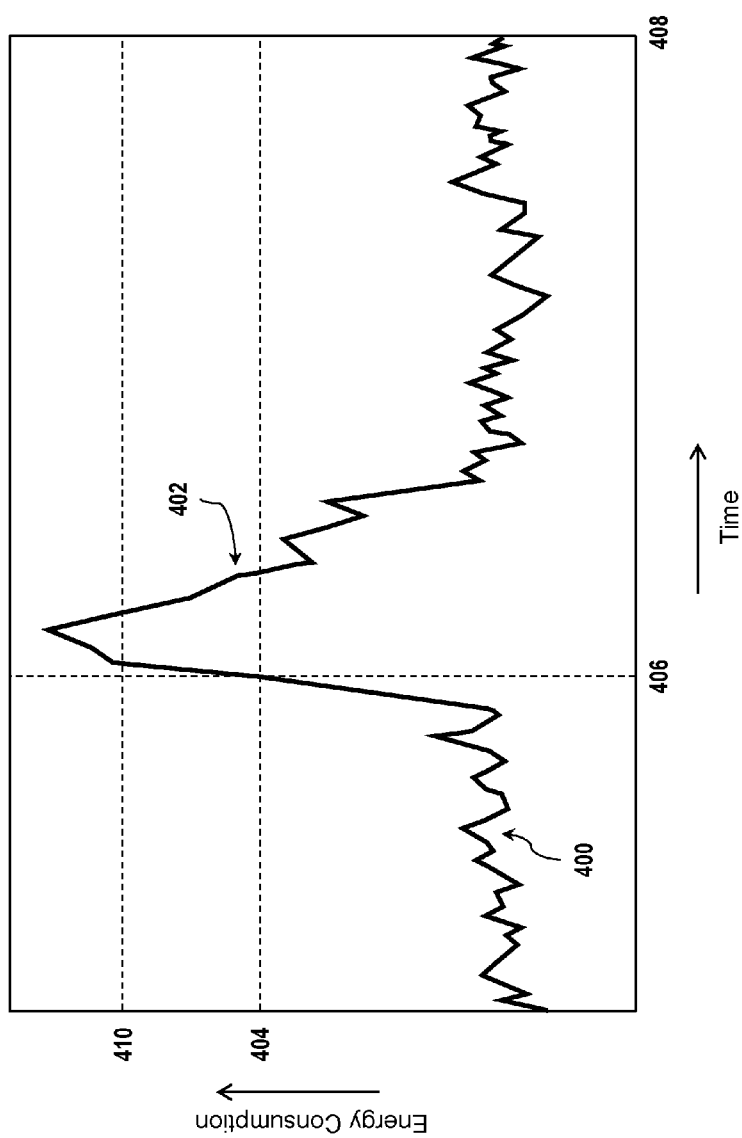
FIG. 4 is a graph showing energy consumption over time that is monitored by an energy consumption mitigation controller illustrating the conditions in which the controller will react to a large-magnitude spike in consumption.

In FIG. 4, the site's measured consumption 400 has a peak 402 that is detected when consumption surpasses the peak triggering threshold 404 at time 406 and surpasses the upper consumption threshold 410 before the end of the waiting period 408, but subsides back to a normal level below the peak triggering threshold 404 before the end 408 as well. In response to this pattern, the controller discharges the ESS at maximum power for a time long enough to counteract the effect of the peak 402 on driving up the average demand of the current demand-averaged period beyond the previous maximum average demand in this billing cycle, which in this case is a longer time than the embodiment of FIG. 3 because the peak 402 is has a greater magnitude and duration than peak 302.

The maximum discharge rate would be used in response to peaks 302 and 402 because the peaks subside before the end of the waiting period and the controller determines that the peaks are spikes. Even if the ESS is depleted while in the process of mitigating the effect of these peaks, there will not be a negative effect of allowing a peak to go unmitigated because the spike has already subsided by the end of waiting periods 308 and 408.

Figure 5:
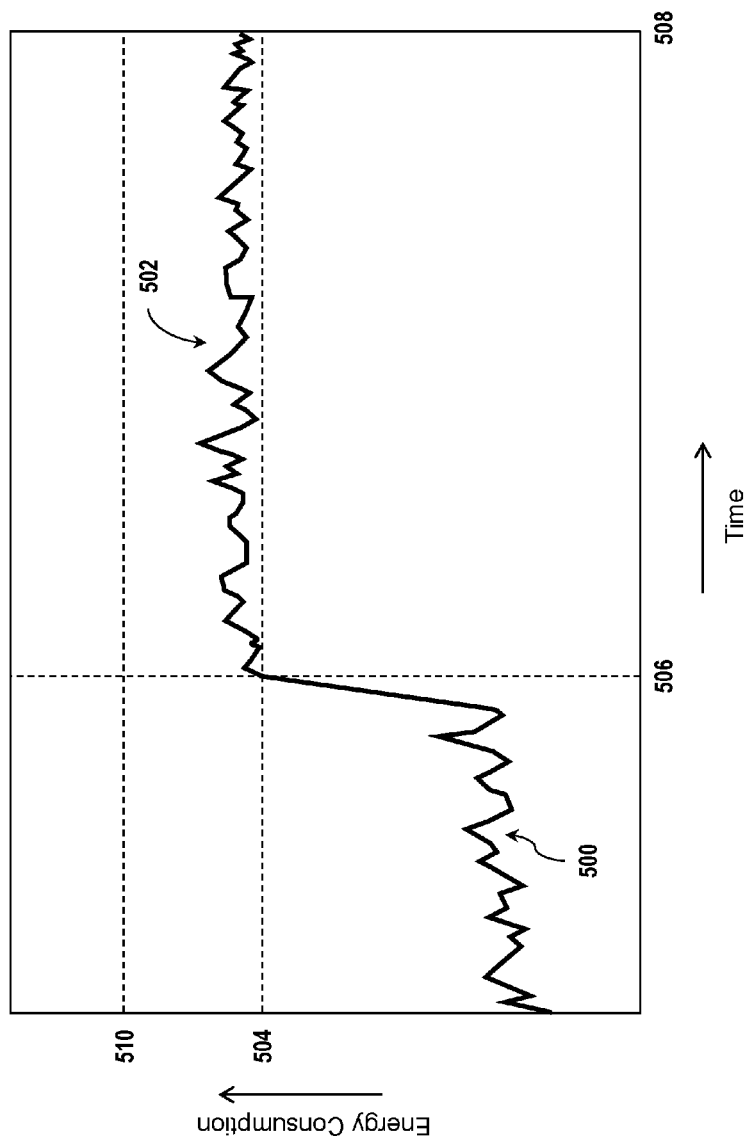
FIG. 5 is a graph showing energy consumption over time that is monitored by an energy consumption mitigation controller illustrating the conditions in which the controller will react to a plateau in consumption.

In FIG. 5, the site's measured consumption 500 has a peak 502 that is detected when consumption surpasses the peak triggering threshold 504 at time 506, but does not surpass upper consumption threshold 510 before the end of the waiting period at time 508. The peak 502 remains above the peak triggering threshold 504 at the end of the waiting period, so it is identified as a plateau. Therefore there are at least three ways that the controller may mitigate it.

First, the controller may cause the ESS to discharge at a reduced rate (i.e., below the maximum discharge rate possible) until the end of the plateau or for a specified period of time, as discussed in connection with the embodiments related to FIG. 2.

Second, the controller may allow inversely proportional discharging of the ESS based on the magnitude of the plateau or based on the duration that discharging has taken place, until the end of the plateau or until the end of a predetermined time period. See, e.g., block 3008 in FIG. 1C. To implement this mitigation method, a peak value is determined by the controller, e.g., the highest consumption level during the peak 502, the average consumption level during the peak 502, the final consumption level of the peak 502, or some combination of these factors or other characteristic peak value. The ESS is then discharged at a rate inversely proportional to the peak value, so, in other words, a higher peak value results in a lower discharge rate and vice versa. For example, the peak value may be compared to a predetermined standard value such as the peak triggering threshold 504 and the discharge rate is set inversely proportional to the difference between those values until the plateau ends, until the ESS is depleted, or some other time period has elapsed.

Third, the controller may enable continuously-variable and inversely proportional discharging, wherein the ESS discharge rate is inversely proportional to the instantaneous consumption rate of the peak. In this embodiment the controller frequently or continuously measures the consumption of the site and accordingly adjusts the discharge of the ESS to values that are inversely proportional to the consumption rate of the peak. This embodiment may similarly use a value like the peak triggering threshold 504 as a reference point in determining the rate of ESS discharge (as would be done in connection with the second plateau mitigation method described previously in connection with FIG. 5), but instead of relying on a single peak value, the peak value is measured multiple times during the duration of the peak. When the peak ends and the site's consumption 500 returns to a normal level, the controller may stop discharging, continue discharging at the final rate, continue discharging at another fixed rate, continue discharging proportional to a fixed value, or continue discharging proportional to the normal consumption until a preset time has passed or until a preset state of charge of the ESS is reached. In some embodiments of this continually-updating inversely proportional mitigation method, if the consumption drops to a critical value, e.g., consumption equals the proportional reference value (such as the peak triggering threshold if it is being used for that purpose), the controller sets the controller to discharge at a fixed value, such as the maximum discharge rate, until the effects of the peak are completely mitigated or the consumption exceeds the critical value again.

Figure 6:
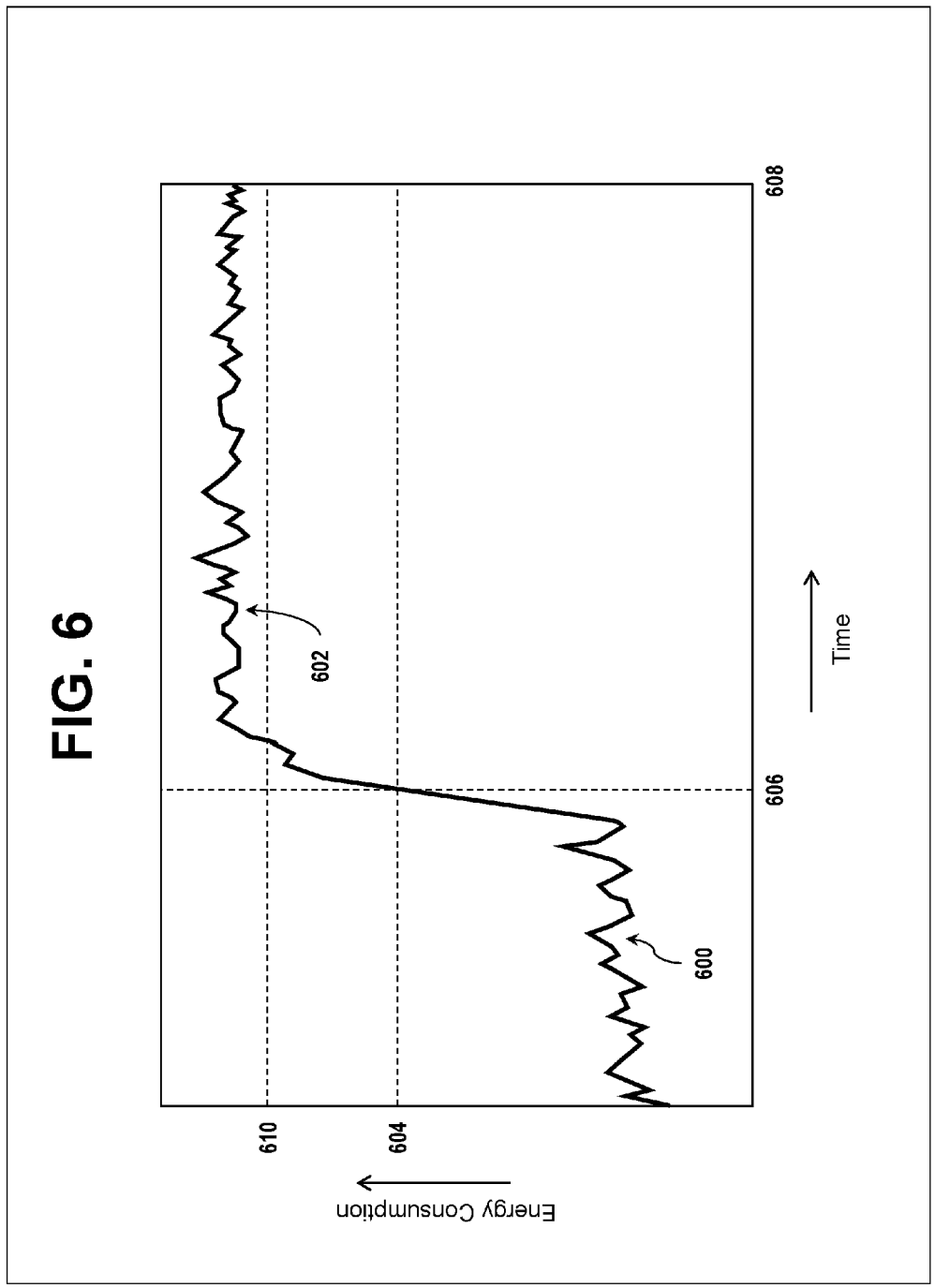
FIG. 6 is a graph showing energy consumption over time that is monitored by an energy consumption mitigation controller illustrating the conditions in which the controller will react to a high-magnitude plateau in consumption.

FIG. 6 is similar to FIG. 5 in that it shows a site's consumption 600 and a peak 602 that exceeds a peak triggering threshold 604 from time 606 until the end of the waiting period 608, resulting in the peak 602 being labeled as a plateau, but in this embodiment, the consumption during the plateau 602 also exceeds an upper consumption threshold 610. If these values are measured during the waiting period, the controller may execute the three mitigation method embodiments described in connection with FIG. 5. For the inversely proportional ESS discharge methods, the discharge rate would likely be lower than the discharge rate resulting from peak 502 because the height of the peak 602 in this embodiment is much greater than the other.

Figure 7:
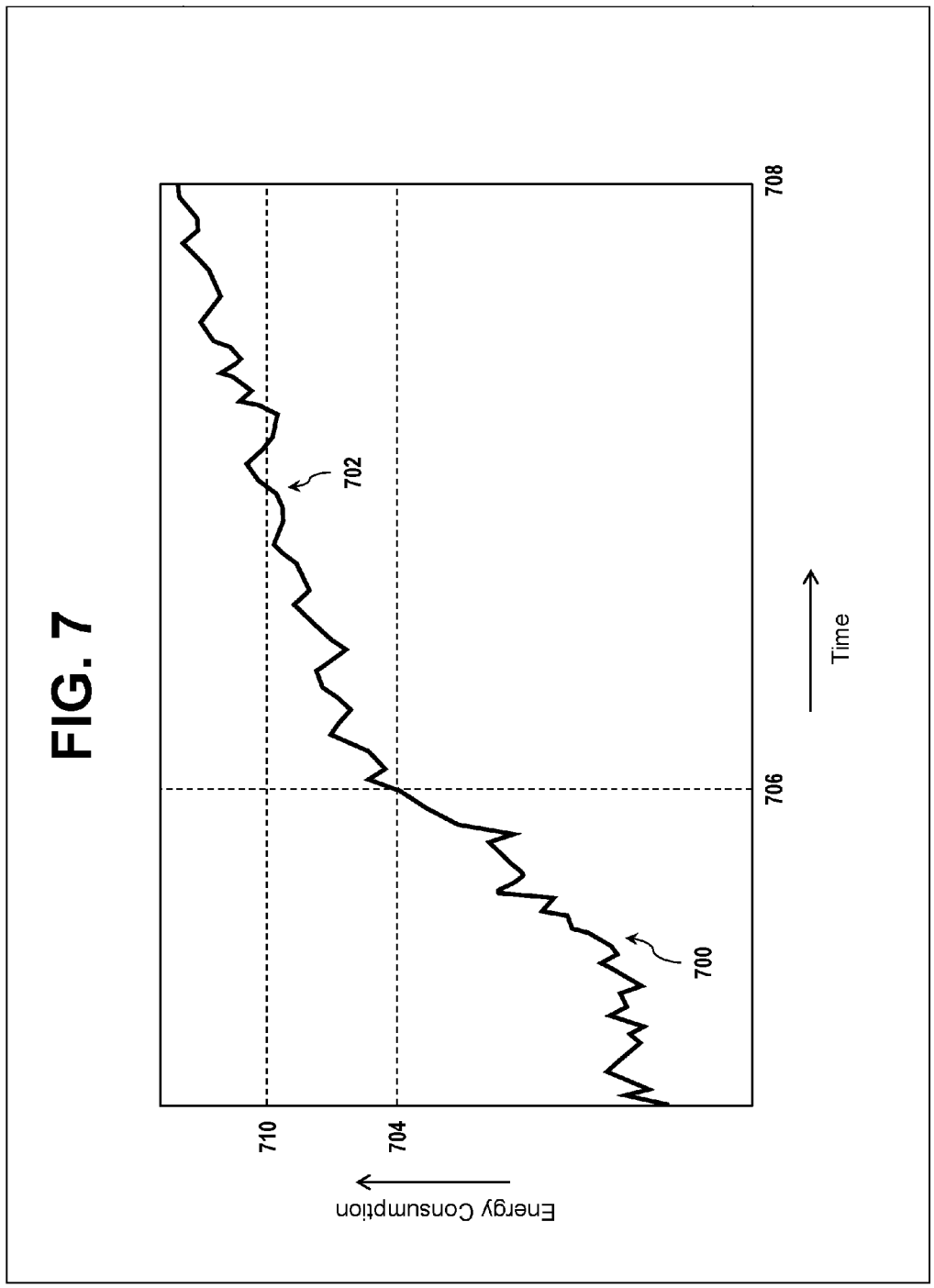
FIG. 7 is a graph showing energy consumption over time that is monitored by an energy consumption mitigation controller illustrating the conditions in which the controller will react to a rising trend in consumption after exceeding a peak triggering threshold.
Figure 8:
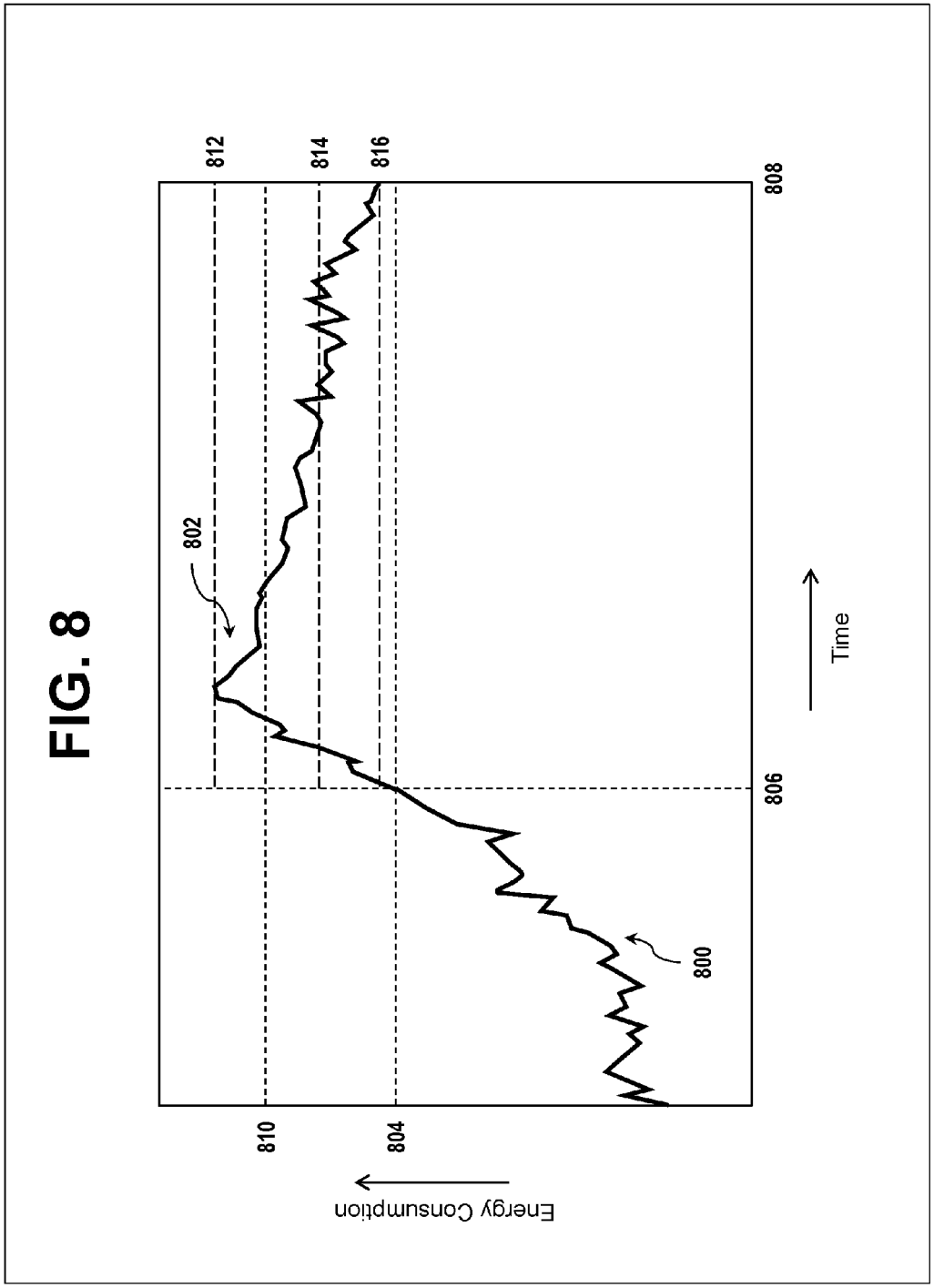
FIG. 8 is a graph showing energy consumption over time that is monitored by an energy consumption mitigation controller illustrating the conditions in which the controller will react to a slowly descending plateau in consumption.

FIG. 6, FIG. 7, and FIG. 8 show some consumption patterns that may have an effect on the method of ESS discharging implemented by the controller, and comparing them may assist in understanding how a controller can respond to these patterns most effectively. In these figures, the consumption of a site 600, 700, and 800 is graphed over time. Peaks 602, 702, and 802 arise when the consumption 600, 700, and 800 exceeds the peak triggering thresholds 604, 704, and 804 at times 606, 706, and 806 and remain above the peak triggering thresholds 604, 704, and 804 until the end points of the waiting periods 608, 708, and 808. Each peak 602, 702, and 802 exceeds the upper consumption threshold 610, 710, and 810 at some point, but the trends in their consumption may cause different mitigation methods to be preferential in each case.

For example, peak 602 is relatively flat and consistent. If this is a typical peak experienced at the site, it may be advantageous to set the controller to always use fixed, non-proportional discharging or fixed, inversely proportional discharging mitigation methods to manage the peak because the peak's consistency dictates that a continually changing inversely proportional discharging method would not likely yield particularly better mitigation results than the other two methods. It is likely that the ESS will discharge at roughly the same rate if the continually changing discharging method is used, so the added complexity of multiple measurements and calculations is mostly unnecessary. If inversely proportional discharging methods are used to mitigate peak 602, it will most likely require a lower-magnitude discharge to successfully mitigate than peak 502 because peak 602 exceeds the upper consumption threshold 610.

Breaching an upper consumption threshold (e.g., 610, 710, 810) may also trigger the controller to change discharge methods in response. For example, in some embodiments the controller may follow the fixed-value non-proportional mitigation method described in connection with FIG. 5 for peaks that have a low magnitude such as peak 502, but an inversely proportional method for peaks like peak 602.

Peak 702 is a gradually rising plateau and peak 802 is a gradually decreasing plateau, so they may be better suited as candidates for using the continually-updating inversely proportional mitigation method to mitigate. If a fixed-value mitigation method were used to mitigate peak 702 and the peak continues to rise, the ESS would discharge during the remainder of peak 702 for longer than either fixed discharge method.

Peak 802 exceeds the peak triggering threshold 804 and gradually descends afterward, so it would likely be most beneficial to mitigate the plateau afterward using the continually-updating inversely proportional method. If this occurs and the peak 802 continues to drop, the ESS will very effectively mitigate the effects of the peak on the average demand in the demand-averaged period in which the peak 802 appears because the ESS discharge rate can increase up to the maximum discharge rate without threat of an unmitigated peak appearing when the ESS is depleted.

FIG. 8 also illustrates several different values that may be used when determining whether the peak is a plateau or a spike, or when determining the rate at which to discharge the ESS if a plateau is detected. Consumption level 812 is the maximum consumption level reached during the peak, level 814 is the average consumption level reached during the peak, and level 816 is the consumption level at the end of the peak. The controller may be advantageously set to use the maximum level 812 for determining discharge characteristics if typical plateaus at the site tend to be long lasting. Using maximum level 812 will result in a conservative (e.g., lower magnitude) ESS discharge rate that will make the ESS deplete later than other embodiments because it is higher than the other embodiments.

The average level 814 may be advantageous in sites where the consumption during a peak fluctuates above and below the peak triggering threshold. Because the consumption frequently crosses the peak triggering threshold during the waiting period, the final value 816 is not preferable as it could lead to a situation where a plateau appears to have a long duration but the controller will interpret the peak as a spike because the final value was just below the peak triggering threshold. By using the average level 814 this scenario can be avoided because more data is synthesized over the waiting period and short term changes in consumption have less of an impact on the result.

The final value 816 may be advantageous in embodiments where the waiting period is very short because it is the simplest way to determine whether a peak is a spike or a plateau, and the shortness of the waiting period helps to minimize the effect of false positives in the peak character detection methods. In some embodiments the final value 816 is well suited for determining the rate at which to discharge the ESS since the ESS needs to be discharged immediately after the end of the waiting period (e.g., after time 808), and if the final value 816 is used, the discharging rate will directly correspond to the consumption level that is set for the discharging period that immediately follows the final consumption level 816.

Conditional Methods

In some embodiments, it is preferable to apply conditions to the prevention of discharging the ESS for a waiting period. In some sites, a predetermined load at the site may be known to have high consumption that may often result in increased electrical utility charges, such as an electric vehicle charging station. In such a case, the method of controlling the discharge of the ESS includes conditional logic or programming characterized in that the ESS is not prevented from discharging for purposes of mitigation the consumption of a peak if (a) a peak is detected and (b) an electrical consumption parameter of the load indicates that the predetermined load is consuming electricity. In some other embodiments, there is an additional condition that (c) the electrical consumption parameter of the load must also indicate that the load is consuming electricity at a high power level or a high average power level, since some loads can vary their energy consumption rate. For instance, there may be an exception built into the method wherein if the electric vehicle charging station is instantaneously consuming 30 kilowatts or more (or some other given value) at any time, or consuming an average of 30 kilowatts (or some other given value) over a short period of time (such as a few seconds), the waiting period is either skipped, and the ESS begins discharging immediately according to a discharging method discussed elsewhere in this document, or the waiting period is shortened significantly to allow the ESS to begin discharging earlier than the usual end of the waiting period.

Likewise, the method may include conditional exceptions to the waiting period for certain loads if those loads are activated in any fashion during the waiting period, wherein those loads are immediately mitigated by a discharge of the ESS.

In a similar fashion, the method of controlling the discharge of the ESS may contain conditions for making exceptional discharge of the ESS during certain time periods. In some sites there are time periods (such as hours, days, weeks, months, etc.) when there is a high probability or certainty of a peak in consumption forming. For example, a site may have a spike in consumption every weekday morning from 8:00 a.m. to 8:20 a.m. because a high-powered electric vehicle charger is always plugged into a vehicle at that time, because there is a scheduled restart of all computers at the site, or because of some other similar predictable or regular event. A site might also have an unusual number of plateaus in consumption during certain predictable months of the year, such as a bakery that runs electric ovens more heavily during November and December for the holidays. Regardless of the source of the peak in consumption, the method may have exceptions built into these times whereby loads at the site are mitigated using the ESS immediately (or much more quickly than the length of a default waiting period) instead of after a waiting period wherein consumption data is measured.

If the method of controlling the discharge of the ESS includes a condition for discharging without a waiting period when certain loads have certain characteristics or during certain time periods, such as periods of regularly high consumption, the user may be able to prevent spiking or plateaus in demand that can result in damaging the electrical systems of the site, tripping circuit breakers, disrupting normal operating conditions of the site or particular loads, exceeding rated consumption thresholds for electrical equipment and wiring at the site, driving up demand charges and other utility charges unnecessarily, and otherwise not using the ESS optimally.

Miscellaneous Definitions and Scope Information

As used herein, an "energy storage system" ("ESS") is a means for storing energy such as, for example, electrochemical batteries, compressed gas storage, pumped hydro storage, flywheel energy storage, capacitative energy storage, superconducting magnetic energy storage, fuel cell energy storage, combinations thereof, and other similar devices for energy storage known in the art. If the energy storage system includes a battery, the battery types may include rechargeable or non-rechargeable chemistries and compositions, such as, for example, lead-acid, alkaline, secondary lead acid, lithium-ion, sodium (zebra), nickel-metal hydride, nickel cadmium, combinations thereof, and other energy storage chemistries known in the art. Energy storage systems may be comprised of small or large numbers of cells, capacities, voltages, amperages, and other battery properties. They may be configured in unitary or modular designs and may follow standardized guidelines or customized specifications. Energy storage systems may also comprise fuel based generators or other means of storing and/or providing energy known in the art that would be able to perform the functions of the ESS described herein.

As used herein, an "energy consumption indicating parameter" is an indicator of energy consumption or a value from which energy consumption can be derived, such as, for example, the current and/or voltage being supplied to an electronic device, the actual power level of a load, and the amount of energy provided to the load over time. These indicators may be measured from within or around the loads or electrical systems or devices and conduits through which they are connected to an energy source, and they may be provided from the loads and electrical systems themselves, such as through reading gauges or meters on the systems or devices or that monitor the systems or devices, reading settings of the systems or devices, reading signals sent to or from the systems or devices, or other like means of determining the energy consumption of a site, electrical load, or system of loads.

Methods and processes described herein may be embodied on or in a computer readable medium. The term "computer readable medium" as used herein includes not only a single physical medium or single type of medium, but also a combination of one or more physical medium and/or types of media. Examples of a computer-readable medium include, but are not limited to, one or more memory chips, hard drives, optical discs (such as CDs or DVDs), magnetic discs, and magnetic tape drives. A computer-readable medium may be considered part of a larger device or it may be itself removable from the device. For example, a commonly-used computer-readable medium is a universal serial bus (USB) memory stick that interfaces with a USB port of a device. A computer-readable medium may store computer-readable instructions (e.g. software) and/or computer-readable data (i.e., information that may or may not be executable). In the present example, a computer-readable medium (such as memory) may be included to store instructions for the controller to operate the discharge of the ESS according to methods described in this document.

In some embodiments the energy storage systems may be integrated with or connected to power management systems, such as those used for peak mitigation, load leveling, or backup or uninterruptible power supplies, since these installations frequently provide the electronic equipment needed to connect an energy storage system to the distribution grid. However, energy storage systems that serve other purposes may be utilized when the necessary connecting equipment is used. Such connecting equipment may comprise power converters for changing voltage signals, inverters for changing AC signals to DC signals (or vice versa), controllers for directing the operation of the power converters, signal conditioning electronics such as stabilizing capacitors, cables, connectors, and other items required to efficiently and safely bring the stored energy to the distribution grid.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

In addition, it should be understood that the figures described above, which highlight the functionality and advantages of the present invention, are presented for example purposes only and not for limitation. The exemplary architecture of the present invention is sufficiently flexible and configurable, such that it may be utilized in ways other than that shown in the figures. It will be apparent to one of skill in the art how alternative functional, logical or physical partitioning, and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise. Although the invention is described above in multiple various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the time described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

Although items, elements or component of the invention may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent. Additionally, the various embodiments set forth herein are described in terms of exemplary illustrations. As will become apparent to one of ordinary skill in the art after reading this document, the illustrated embodiments and their various alternatives can be implemented without confinement to the illustrated examples.

Further, the purpose of the Abstract is to enable the U.S. Patent and Trademark Office and the public generally, and especially the scientists, engineers, and practitioners in the art who are not familiar with patent or legal terms or phraseology to determine quickly from a cursory inspection the nature and essence of the technical disclosure of the application. The Abstract is not intended to be limiting as to the scope of the present invention in any way.

What is claimed is:

1. A method of electricity consumption mitigation using an electrical energy storage system (ESS) at a site, the method comprising:
    measuring electricity consumption of the site;
    detecting a peak in electricity consumption of the site;
    responsive to detecting the peak, suspending discharge of the ESS for a predetermined waiting period;
    measuring an electrical characteristic of the peak during the waiting period;

discharging an amount of energy from the ESS after the waiting period has elapsed, wherein the amount of energy is proportional or inversely proportional to the measured electrical characteristic.

2. The method of claim 1, wherein the electrical characteristic is a magnitude of the electricity consumption of the site.

3. The method of claim 2, wherein the electrical characteristic is an average magnitude of the electricity consumption of the site over the duration of the waiting period.

4. The method of claim 1, wherein the electrical characteristic is a duration of the peak in electricity consumption, the duration being a length of time that the magnitude of the peak exceeds a threshold value.

5. The method of claim 1, wherein the electrical characteristic is a peak amount of energy consumed by the site during the peak in excess of a threshold value.

6. The method of claim 1, wherein the amount of energy discharged from the ESS is proportional to a state of charge of the ESS.

7. The method of claim 1, wherein a rate of discharge of the ESS is proportional to a state of charge of the ESS.

8. The method of claim 1, further comprising classifying the peak as a spike or a plateau.

9. The method of claim 8, wherein when the peak is classified as a plateau, discharging the amount of energy from the ESS at a lower rate of discharge than if the peak were classified as a plateau.

10. The method of claim 8, wherein when the peak is classified as a plateau, the amount of energy discharged from the ESS after the waiting period is proportional to the state of charge of the ESS.

11. The method of claim 8, wherein when the peak is classified as a plateau, a rate of discharge of the ESS after the waiting period is inversely proportional to the magnitude of the plateau or the duration that discharging has taken place.

12. The method of claim 1, wherein the waiting period is shortened or lengthened based on a time remaining in a demand-averaged period in which the waiting period begins.

13. The method of claim 1, further comprising measuring electricity consumption or generation of an electrical device at the site, wherein the waiting period is shortened or lengthened based on the consumption or generation of the electrical device at the site.

14. A tangible computer-readable medium including computer-executable instructions stored thereon for performing a method for controlling the discharge of an energy storage system (ESS) for electricity consumption mitigation, the ESS being connected to an electrical distribution grid at a site, the method comprising:
   measuring electricity consumption of the site;
   detecting a peak in electricity consumption of the site;
   responsive to detecting the peak, suspending discharge of the ESS for a predetermined waiting period;
   measuring an electrical characteristic of the peak during the waiting period;
   discharging an amount of energy from the ESS after the waiting period has elapsed, wherein the amount of energy is proportional or inversely proportional to the measured electrical characteristic.

15. The tangible computer-readable medium of claim 14, wherein the amount of energy discharged from the ESS is proportional to a state of charge of the ESS.

16. The tangible computer-readable medium of claim 14, wherein a rate of discharge of the ESS is proportional to a state of charge of the ESS.

17. An apparatus for controlling the discharge of an energy storage system (ESS) for electricity consumption mitigation, the ESS being connected to an electrical distribution grid at a site, the apparatus comprising:
   a processor; and
   a memory storing instructions executable by the processor to perform processes that include:
   measuring electricity consumption of the site;
   detecting a peak in electricity consumption of the site;
   responsive to detecting the peak, suspending discharge of the ESS for a predetermined waiting period;
   measuring an electrical characteristic of the peak during the waiting period;
   discharging an amount of energy from the ESS after the waiting period has elapsed, wherein the amount of energy is proportional or inversely proportional to the measured electrical characteristic.

18. The apparatus of claim 17, wherein the instructions further comprise that the amount of energy discharged from the ESS is proportional to a state of charge of the ESS.

19. The apparatus of claim 17, wherein the instructions further comprise that a rate of discharge of the ESS is proportional to a state of charge of the ESS.

20. The method of claim 17, wherein the instructions further comprise classifying the peak as a spike or a plateau.

* * * * *